United States Patent
Wu et al.

(10) Patent No.: US 9,801,267 B2
(45) Date of Patent: Oct. 24, 2017

(54) WIRING STRUCTURE OF HIGH FREQUENCY SIGNAL WIRES AND PCB

(71) Applicant: BOE TECHNOLOGY GROUP CO., LTD., Beijing (CN)

(72) Inventors: Yue Wu, Beijing (CN); Fei Yang, Beijing (CN); Min He, Beijing (CN); Yu Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/219,935

(22) Filed: Jul. 26, 2016

(65) Prior Publication Data

US 2017/0280556 A1    Sep. 28, 2017

(30) Foreign Application Priority Data

Mar. 23, 2016   (CN) .......................... 2016 1 0169941

(51) Int. Cl.
*H05K 1/11* (2006.01)
*H05K 1/02* (2006.01)

(52) U.S. Cl.
CPC ................... *H05K 1/0237* (2013.01)

(58) Field of Classification Search
CPC ... H05K 1/0254; H05K 1/0263; H05K 1/0237

USPC ........ 174/261, 250, 251, 255, 256, 257, 259
See application file for complete search history.

(56) References Cited

U.S. PATENT DOCUMENTS

2013/0318785 A1* 12/2013 Hsu ........................ H05K 3/108
                                                              29/850

* cited by examiner

*Primary Examiner* — Tremesha S Willis
(74) *Attorney, Agent, or Firm* — Nath, Goldberg & Meyer; Joshua B. Goldberg

(57) ABSTRACT

The present invention provides a wiring structure of high frequency signal wires and a PCB board including the wiring structure of high frequency signal wires. A test part is formed by extending a high frequency signal wire from a connection end connected with a solder pad, and a test window corresponding to a position of the test part is provided on a copper foil which covers the solder pad and the test part, to expose the high frequency signal wire, such that a high frequency signal transmitted via the high frequency signal wire can be directly tested at the test window. Thus, circular test points used in the prior art can be removed, to effectively solve the problem of insufficient space on a PCB; accordingly, lengths of the high frequency signal wires become more precise, so as to ensure a synchronization of transmission of the high frequency signal wires.

16 Claims, 2 Drawing Sheets

WIRING STRUCTURE OF HIGH FREQUENCY SIGNAL WIRES AND PCB

TECHNICAL FIELD

The present invention relates to the field of semiconductor device manufacturing technologies, and in particular relates to a wiring structure of high frequency signal wires and a PCB board.

BACKGROUND

In the field of printed circuit board (PCB) technology, the existing wiring structure of high frequency signal wires not only includes structures such as high frequency signal wires, solder pads and the like, but also includes circular test points. The circular test points are connected to the high frequency signal wires, for testing high frequency signals transmitted by the high frequency signal wires.

The wiring structure of high frequency signal wires in the prior art has at least following defects:

1. Because each high frequency signal wire is connected to a circular test point, and the circular test point occupies a large area on a PCB, it is impossible to dispose other circuits in the area where the circular test point is located, resulting in crowdedness or insufficient space for PCB elements; and 2. Each high frequency signal wire is connected to a circular test point via a wire, and this wire causes a difference between lengths of high frequency signal wires, thereby affecting synchronization of transmission of the high frequency signal wires.

Thus, there is an urgent need for a wiring structure of high frequency signal wires and a PCB board that can solve at least one of the above technical problems.

SUMMARY

As for the above problems existing in the prior art, the present invention provides a wiring structure of high frequency signal wires and a PCB board, for solving the problems of insufficient space on a PCB, difference in lengths of high frequency signal wires, etc.

According to an aspect of the present invention, there is provided a wiring structure of high frequency signal wires, comprising a solder pad, a high frequency signal wire and a copper foil, the high frequency signal wire soldered onto the solder pad. The high frequency signal wire extends from a connection end connected to the solder pad, to form a test part, the copper foil partially covers the solder pad and the test part, and a test window corresponding to a position of the test part is provided on the copper foil, to expose the high frequency signal wire.

According to an embodiment of the invention, a length of the test part may be greater than a length of the solder pad.

According to an embodiment of the invention, a length of the copper foil may be smaller than a sum of a length of the test part and a length of the solder pad.

According to an embodiment of the invention, a length of the copper foil may be twice of a length of the solder pad.

According to an embodiment of the invention, a width of the copper foil may be equal to a width of the solder pad.

According to an embodiment of the invention, a projection of a first edge of the solder pad adjacent to the test window on the copper foil may be spaced apart from a second edge of the test window adjacent to the solder pad by a first preset distance.

According to an embodiment of the invention, other edges of the test window than the second edge may be respectively spaced apart from corresponding edges of the copper foil by a second preset distance.

According to an embodiment of the invention, the first preset distance may be greater than the second preset distance.

According to another aspect of the present invention, there is provided a PCB board, comprising the wiring structure of high frequency signal wires according to the present invention.

In the wiring structure of high frequency signal wires according to the invention and the PCB board including the wiring structure of high frequency signal wires, a test part is formed by extending a high frequency signal wire from a connection end connected with a solder pad, and a test window corresponding to a position of the test part is provided on a copper foil which covers the solder pad and the test part, to expose the high frequency signal wire, such that a high frequency signal transmitted via the high frequency signal wire can be directly tested at the test window. Thus, circular test points used in the prior art can be removed, to effectively solve the problem of insufficient space on a PCB; accordingly, because the circular test points and connection wires between the high frequency signal wires and the circular test points are removed, lengths of the high frequency signal wires become more precise, so as to ensure a synchronization of transmission of the high frequency signal wires.

BRIEF DESCRIPTION OF THE FIGURES

The accompanying drawings, which constitute a part of the specification, are provided for further understanding of the present invention, and for explaining the present invention along with the following specific implementations, but not intended to limit the present invention, in the drawings.

DETAILED DESCRIPTION

The technical solutions in the present invention will be clearly and fully described below in conjunction with the accompanying drawings of the invention. Apparently, the embodiments to be described are part of embodiments of the invention, rather than all of the embodiments. All other embodiments obtained by those with ordinary skill in the art, based on the embodiments in the present invention, without doing creative work belong to the protection scope of the present invention.

Figure 1A:
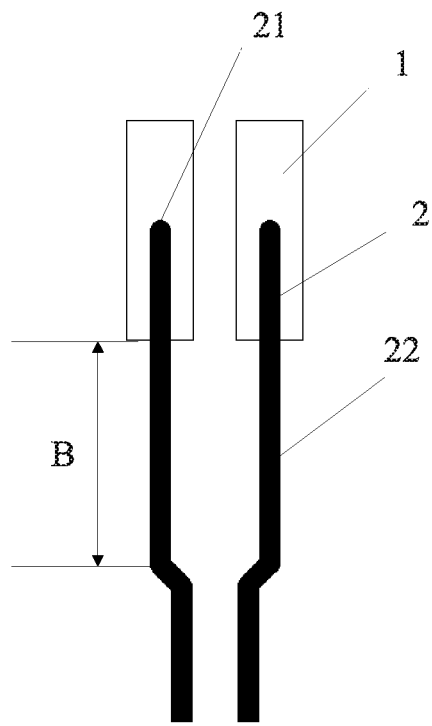
FIG. 1A and FIG. 1B are schematic decomposition diagrams of the wiring structure of high frequency signal wires according to an embodiment of the invention.
Figure 1B:
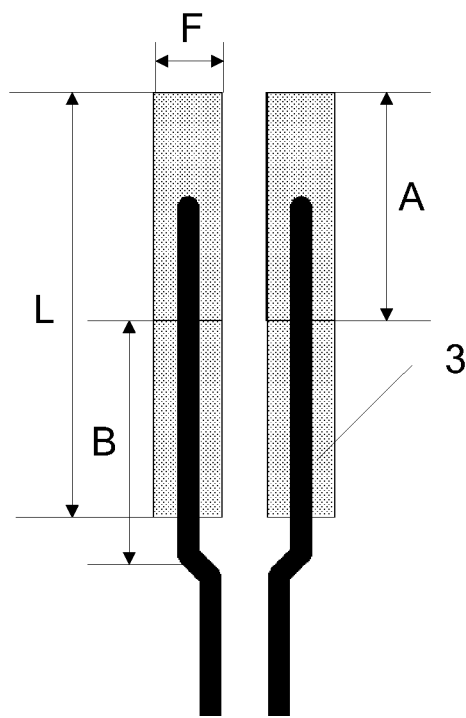
Figure 2:
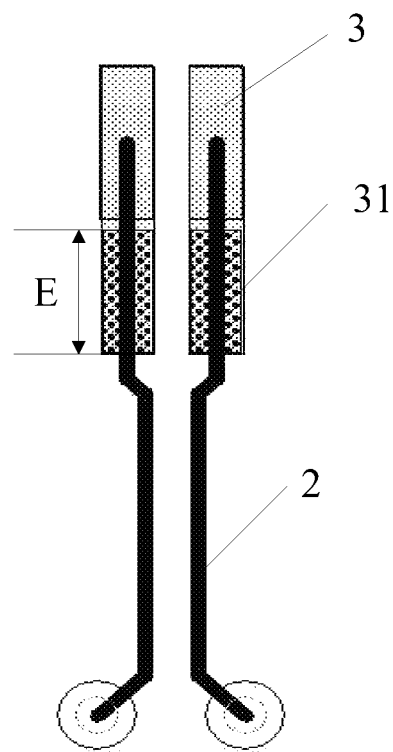
FIG. 2 is a schematic diagram of an entirety of the wiring structure of high frequency signal wires according to an embodiment of the invention.

FIG. 1A and FIG. 1B are schematic decomposition diagrams of the wiring structure of high frequency signal wires according to an embodiment of the invention, and FIG. 2 is a schematic diagram of an entirety of the wiring structure of high frequency signal wires according to an embodiment of the invention.

Referring to FIG. 1A, FIG. 1B and FIG. 2, the wiring structure of high frequency signal wires according to an embodiment of the invention may include a solder pad 1, a high frequency signal wire 2 and a copper foil 3. The high frequency signal wire 2 is soldered onto the solder pad 1, and extends from the connection end 21, at which the high frequency signal wire 2 is soldered to the solder pad 1, to form a test part 22. The copper foil 3 partly covers the solder pad 1 and the test part 22 of the high frequency signal wire 2, and a test window 31 corresponding to a position of the test part 22 is provided on the copper foil 3, to expose the high frequency signal wire 2.

Specifically, in a top layer of a PCB, the solder pad 1 and the high frequency signal wire 2 are covered with the copper foil 3 which has a same electrical property as the high frequency signal wire 2. Because the copper foil 3 and the high frequency signal wire 2 are manufactured by identical manufacturing processes, when manufacturing the PCB board, the high frequency signal wire 2 and the copper foil 3 may be covered with green oil serving as a solder mask. According to an embodiment of the invention, the test window 31 may be formed by digging away a part of the green oil at the position on the copper foil 3 corresponding to the test part 22 to open a window in the solder mask. Thus, the high frequency signal wire 2 may be exposed by the test window 31, so as to test a high frequency signal transmitted by the high frequency signal wire 2.

In the wiring structure of high frequency signal wires according to the invention, a test part is formed by extending a high frequency signal wire from a connection end connected with a solder pad, and a test window corresponding to a position of the test part is provided on a copper foil which covers the solder pad and the test part, to expose the high frequency signal wire, such that a high frequency signal transmitted via the high frequency signal wire can be directly tested at the test window. Thus, circular test points used in the prior art can be removed, to effectively solve the problem of insufficient space on a PCB; accordingly, because the circular test points and connection wires between the high frequency signal wires and the circular test points are removed, lengths of the high frequency signal wires become more precise, so as to ensure a synchronization of transmission of the high frequency signal wires.

As shown in FIG. 1B, a length of the copper foil 3 is L, a length of the solder pad 1 is A, a width of the solder pad 1 is F, and a length of the test part 22 is B. According to an embodiment of the invention, the length B of the test part 22 may be greater than the length A of the solder pad 1, i.e. B>A, to ensure that the test window has a sufficient test area. Further, according to an embodiment of the invention, the length L of the copper foil 3 may be smaller than a sum of the length B of the test part 22 and the length A of the solder pad 1, i.e. L<A+B. According to an embodiment of the invention, the length L of the copper foil 3 may be twice the length A of the solder pad 1, i.e. L=2A.

Figure 3:
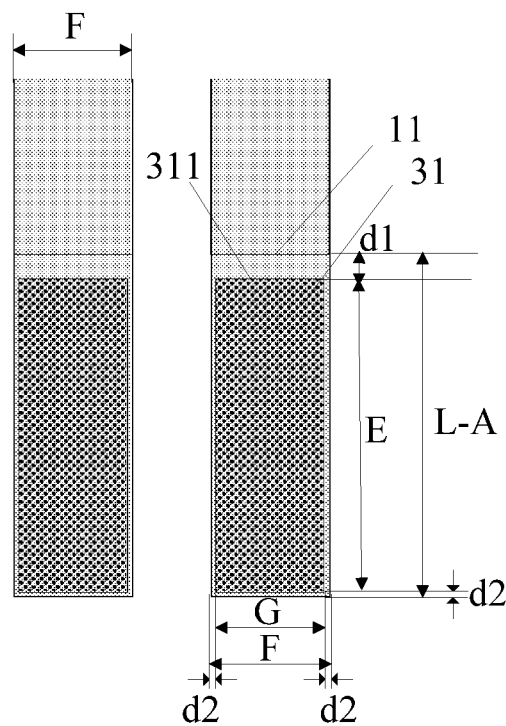
FIG. 3 is an enlarged view of a test window on a copper foil of the wiring structure of high frequency signal wires according to an embodiment of the invention.

FIG. 3 is an enlarged view of the test window on the copper foil of the wiring structure of high frequency signal wires according to an embodiment of the invention.

Referring to FIG. 3, a width of the copper foil 3 may be equal to the width of the solder pad 1. Since the connection end 21 of the high frequency signal wire 2 is soldered to the solder pad 1, and the width F of the solder pad 1 is greater than a width of the high frequency signal wire 2, the width F of the copper foil 3 is greater than the width of the high frequency signal wire 2, so as to facilitate forming the test window 31, to ensure a sufficient test area. Further, the equal widths of the copper foil 3 and the solder pad 1 may allow the copper foil 3 to exactly cover the solder pad 1.

As shown in FIG. 3, a width of the test window 31 is G, a length thereof is E, and the width G of the test window 31 may be smaller than the width F of the copper foil 3. A projection of a first edge 11 of the solder pad 1 adjacent to the test window 31 on the copper foil 3 and a second edge 311 of the test window 31 adjacent to the solder pad 1 may be spaced apart from each other by a first preset distance d1. That is, the test window 31 is not immediately adjacent to the solder pad 1, but spaced apart from the solder pad 1 by a distance (i.e. d1). Thus, the copper foil 3 can be clearly divided into a solder-pad area and a non-solder-pad area, to avoid error in soldering position.

Other edges of the test window 31 than the second edge 311 may be respectively spaced apart from corresponding edges of the copper foil 3 by a second preset distance d2. That is, the test window 31 may be at a central position of the non-solder-pad area of the copper foil 3, such that a part of the copper foil 3 surrounding the test window 31 is entirely covered with green oil, protecting the copper foil 3, to prevent the part of the copper foil 3 from being poked by a test probe when performing a PCB final product test.

According to an embodiment of the invention, the first preset distance d1 may be greater than the second preset distance d2, to ensure that the test window 31 has a sufficient test area.

The wiring structure of high frequency signal wires according to the present invention is applicable to a PCB board, to directly test high frequency signals transmitted via the high frequency signal wires at the test window. Thus, circular test points used in the prior art can be removed, to effectively solve the problem of insufficient space on a PCB; accordingly, since the circular test points and connection wires between high frequency signal wires and the circular test points are removed, a length of each of the high frequency signal wires becomes more precise, so as to ensure a synchronization of transmission of the high frequency signal wires.

It can be understood that the foregoing implementations are merely exemplary implementations used for describing the principle of the present invention, but the present invention is not limited thereto. Those of ordinary skill in the art may make various variations and modifications without departing from the spirit and essence of the present invention, and these variations and modifications shall fall into the protection scope of the present invention.

The invention claimed is:

1. A wiring structure of high frequency signal wires, comprising a solder pad, a high frequency signal wire and a copper foil, the high frequency signal wire soldered onto the solder pad,
   wherein, the high frequency signal wire extends from a connection end connected to the solder pad, to form a test part, the copper foil partially covers the solder pad and the test part, and a test window corresponding to a position of the test part is provided on the copper foil, to expose the high frequency signal wire.

2. The wiring structure of high frequency signal wires according to claim 1, wherein a length of the test part is greater than a length of the solder pad.

3. The wiring structure of high frequency signal wires according to claim 1, wherein a length of the copper foil is smaller than a sum of a length of the test part and a length of the solder pad.

4. The wiring structure of high frequency signal wires according to claim 1, wherein a length of the copper foil is twice of a length of the solder pad.

5. The wiring structure of high frequency signal wires according to claim 1, wherein a width of the copper foil is equal to a width of the solder pad.

6. The wiring structure of high frequency signal wires according to claim 1, wherein a projection of a first edge of the solder pad adjacent to the test window on the copper foil is spaced apart from a second edge of the test window adjacent to the solder pad by a first preset distance.

7. The wiring structure of high frequency signal wires according to claim 6, wherein other edges of the test window than the second edge are respectively spaced apart from corresponding edges of the copper foil by a second preset distance.

8. The wiring structure of high frequency signal wires according to claim 7, wherein the first preset distance is greater than the second preset distance.

9. A printed circuit board (PCB), comprising the wiring structure of high frequency signal wires according to claim 1.

10. The PCB according to claim 9, wherein a length of the test part is greater than a length of the solder pad.

11. The PCB according to claim 9, wherein a length of the copper foil is smaller than a sum of a length of the test part and a length of the solder pad.

12. The PCB according to claim 9, wherein a length of the copper foil is twice of a length of the solder pad.

13. The PCB according to claim 9, wherein a width of the copper foil is equal to a width of the solder pad.

14. The PCB according to claim 9, wherein a projection of a first edge of the solder pad adjacent to the test window on the copper foil is spaced apart from a second edge of the test window adjacent to the solder pad by a first preset distance.

15. The PCB according to claim 14, wherein other edges of the test window than the second edge are respectively spaced apart from corresponding edges of the copper foil by a second preset distance.

16. The PCB according to claim 15, wherein the first preset distance is greater than the second preset distance.

* * * * *